(12) United States Patent
Tominaga

(10) Patent No.: US 10,620,734 B2
(45) Date of Patent: Apr. 14, 2020

(54) TOUCH-PANEL-EQUIPPED DISPLAY DEVICE

(71) Applicant: Sharp Kabushiki Kaisha, Sakai, Osaka (JP)

(72) Inventor: Masakatsu Tominaga, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 18 days.

(21) Appl. No.: 16/207,235

(22) Filed: Dec. 3, 2018

(65) Prior Publication Data
US 2019/0171321 A1    Jun. 6, 2019

(30) Foreign Application Priority Data

Dec. 5, 2017 (JP) ................................. 2017-233586

(51) Int. Cl.
*G06F 3/041* (2006.01)
*H01L 27/12* (2006.01)
(Continued)

(52) U.S. Cl.
CPC ........ *G06F 3/0412* (2013.01); *G02F 1/13338* (2013.01); *G02F 1/13452* (2013.01);
(Continued)

(58) Field of Classification Search
CPC ........... G02F 1/136286; G02F 1/13338; G02F 1/134363; G02F 1/13452; H01L 27/124; G06F 3/0412; G06F 3/044
See application file for complete search history.

(56) References Cited

U.S. PATENT DOCUMENTS 9,098,161 B2 * 8/2015 Shin .................... G06F 3/0412
2015/0145821 A1 * 5/2015 Kim ..................... G06F 3/0412
345/174

FOREIGN PATENT DOCUMENTS

JP           2015-122057 A        7/2015

* cited by examiner

*Primary Examiner* — Kent W Chang
*Assistant Examiner* — Scott Au
(74) *Attorney, Agent, or Firm* — Keating & Bennett, LLP

(57) ABSTRACT

Provided is a technique that makes it possible to reduce display defects in a touch panel integrated display device. A touch-panel-equipped display device includes an active matrix substrate that includes a plurality of pixels each of which corresponds to any one of N colors (N is a natural number equal to or greater than three). The active matrix substrate includes: a plurality of source lines; a plurality of common electrodes that are used commonly for both of image display and touch position detection; and a plurality of signal lines that are connected with the common electrodes, respectively. Outside a display area of the active matrix substrate, the active matrix substrate includes: a source line driving circuit; a common electrode driving circuit that supplies a predetermined voltage signal to the signal lines; source line connection parts 12 that connect the source lines and the source line driving circuit; and signal line connection parts 510 that connect the signal lines and the common electrode driving circuit. The source line connection parts are arranged in such a manner that N source line connection parts 121(G), 122(R), 123(B) connected with the source lines of N of the pixels corresponding to N colors, respectively, are arranged in different layers so as to overlap with one another when viewed in a plan view. The signal line connection parts 510 are arranged at positions that do not overlap with the source line connection parts 12 when viewed in a plan view.

4 Claims, 11 Drawing Sheets

(51) Int. Cl.
*G02F 1/1333* (2006.01)
*G02F 1/1362* (2006.01)
*G02F 1/1343* (2006.01)
*G06F 3/044* (2006.01)
*G02F 1/1345* (2006.01)

(52) U.S. Cl.
CPC .. *G02F 1/134363* (2013.01); *G02F 1/136286* (2013.01); *G06F 3/044* (2013.01); *G06F 3/0443* (2019.05); *G06F 3/04166* (2019.05); *H01L 27/124* (2013.01); *G02F 2201/52* (2013.01)

FIG. 11A
| R | G | B | R | G | B | R | G | B | R | G | B |
|---|---|---|---|---|---|---|---|---|---|---|---|
| + | − | + |   |   |   | + | − | + |   |   |   |
|   |   |   | − | + | − |   |   |   | − | + | − |
| + | − | + |   |   |   | + | − | + |   |   |   |
FIG. 11B
| R | G | B | R | G | B | R | G | B | R | G | B |
|---|---|---|---|---|---|---|---|---|---|---|---|
| + | − | + | 0 | 0 | 0 | + | − | + | 0 | 0 | 0 |
| 0 | 0 | 0 | − | + | − | 0 | 0 | 0 | − | + | − |
| + | − | + | 0 | 0 | 0 | + | − | + | 0 | 0 | 0 |
FIG. 11C
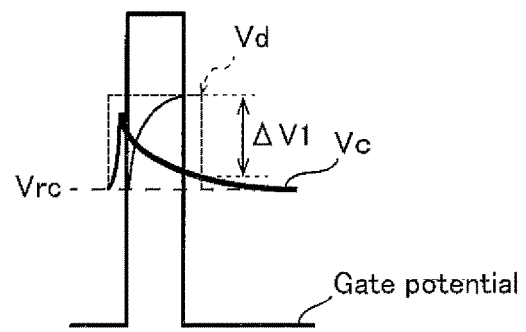
FIG. 11D
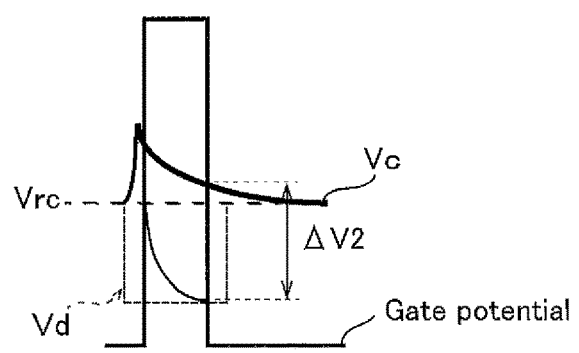

TOUCH-PANEL-EQUIPPED DISPLAY DEVICE

TECHNICAL FIELD

The present invention relates to a touch-panel-equipped display device.

BACKGROUND ART

Patent Document 1 indicated below discloses a touch screen panel integrated display device that includes a panel that serves as both of a display and a touch screen. On the panel, a plurality of pixels are formed, and each pixel is provided with a pixel electrode, and a transistor connected to the pixel electrode. Further, on the panel, a plurality of electrodes are arranged with spaces therebetween. The plurality of electrodes function as common electrodes that form lateral electric fields (horizontal electric fields) between the same and the pixel electrodes in the display driving mode, and function as touch electrodes that form electrostatic capacitors between the same and a finger or the like in the touch driving mode. At least one signal line, approximately parallel with data lines, is connected to each of the plurality of electrodes, so that a touch driving signal or a common voltage signal is supplied thereto via the signal line.

PRIOR ART DOCUMENT

Patent Document

Patent Document 1: JP-A-2015-122057

SUMMARY OF THE INVENTION

Problem to be Solved by the Invention

In order to make a frame narrower in a touch panel integrated display device as that disclosed in Patent Document 1 described above, source line connection lines for connecting a plurality of source lines and a source driver are arranged so as to overlap with one another with insulating films being interposed, outside a display area, in some cases.

More specifically, for example, among source lines of three types provided for pixels of three colors of red (R), green (G), and blue (B) (hereinafter referred to as pixels R, pixels G, and pixels B), respectively, source line connection lines for the source lines provided for the pixels R and the pixels G, respectively, are arranged so as to overlap with each other with an insulating film being interposed. The source line connection lines for the source lines provided for the pixels B are arranged so as to overlap with lines (hereinafter referred to as common electrode connection lines) that signal lines connected with touch electrodes (common electrodes) and a controller that supplies a predetermined voltage to the signal lines, with an insulating film being interposed therebetween.

If the common electrode connection line is arranged so as overlap with the source line connection line with an insulating film being interposed therebetween in this way, a load capacitance applied to the common electrode connection line increases, resulting in that a signal delay tends to occur to the common electrode connection line. Such a signal delay occurring to the common electrode connection line causes an appropriate potential not to be held at the common electrode, resulting in that display defects occur. Among display defects, particularly, in a case where column reverse driving, dot inversion driving, or the like is performed, the potential of the common electrode shifts according to the polarity of a data voltage, and a display defect called greenish screen tends to occur easily.

The following description describes a display pattern to which the phenomenon of the greenish screen tends to occur. FIG. 11A schematically illustrates a display pattern of pixels that display black color in a checkered pattern in a case where column reverse driving is performed. FIG. 11B indicate polarities of data voltages of pixels in a case where the display illustrated in FIG. 11A is performed on a normally black liquid crystal panel that displays black color in a state in which no voltage is applied. In FIG. 11B, "0" is set at the pixels displaying black color. In this case, since the number of the pixels R and the pixels B in each row is greater than the number of the pixels G, the polarity of data voltages of the pixels R and the pixels B is dominant as compared with the polarity of data voltages of the pixels G, and as a result, the common electrode potential Vc of the pixels at the timing of data writing with respect to the pixels of each row rises or falls from the original potential Vrc depending on the polarity of the data voltages of the pixels R and the pixels B. For example, in a case where the polarity of the data voltages of the pixels R and the pixels B is positive (+) and the polarity of the data voltages of the pixels G is negative (−), the potential Vc of the common electrode is boosted up in the positive (+) direction, from the original potential Vrc. Accordingly, the potential difference ΔV2 illustrated in FIG. 11D, between the voltage (drain voltage) Vd applied to the pixels G and the common electrode potential Vc, is greater than the potential difference ΔV1 illustrated in FIG. 11C, between the voltage (drain voltage) Vd applied to the pixels R and the pixels B and the common electrode potential Vc. It should be noted that this potential difference with respect to the pixel G is greater than the potential difference with respect to the pixels R and the pixels B, also in a case where the polarities of data voltages applied to the respective pixels are opposite to those in the above-described case. Consequently, the pixels G have higher brightness that that of the pixels R and the pixels B, and therefore, the display on the display screen as a whole goes greenish.

It is an object of the present invention to provide a technique for reducing display defects in a touch panel integrated display device.

Means to Solve the Problem

A touch-panel-equipped display device in one embodiment of the present invention is a touch-panel-equipped display device including an active matrix substrate that includes a plurality of pixels each of which corresponds to any one of N colors (N is a natural number equal to or greater than three), wherein the active matrix substrate includes: a plurality of source lines that are provided with respect to the pixels, respectively; a plurality of common electrodes that are used commonly for both of image display and touch position detection; a plurality of signal lines that are connected with the common electrodes, respectively; a source line driving circuit that is provided outside a display area and supplies data signals to the source lines; a common electrode driving circuit that is provided outside the display area and supplies a predetermined voltage signal to the signal lines; a plurality of source line connection parts that connect the source lines and the source line driving circuit; and a plurality of signal line connection parts that connect the signal lines and the common electrode driving circuit, wherein the source line connection parts are arranged in such a manner that N of the source line connection parts connected with the source lines of N adjacent ones of the pixels are arranged in different layers so that the N source line connection parts overlap with one another when viewed in a plan view, and the signal line connection parts are arranged at positions that do not overlap with the source line connection parts when viewed in a plan view.

Effect of the Invention

With the present invention, display defects can be reduced in a touch panel integrated display device.

BRIEF DESCRIPTION OF DRAWINGS

FIG. 4B is a schematic cross-sectional view taken along line A-A in

FIG. 4A.

FIG. 11A is a diagram for explaining a conventional problem, and schematically illustrates a display pattern in which the phenomenon of the greenish screen occurs.

FIG. 11B schematically illustrates data voltages in the display pattern illustrated in FIG. 11A.

FIG. 11C explains a potential of the pixel R and the pixel B in FIG. 11B.

FIG. 11D explains a potential of the pixel G in FIG. 11B.

MODE FOR CARRYING OUT THE INVENTION

Figure 1:
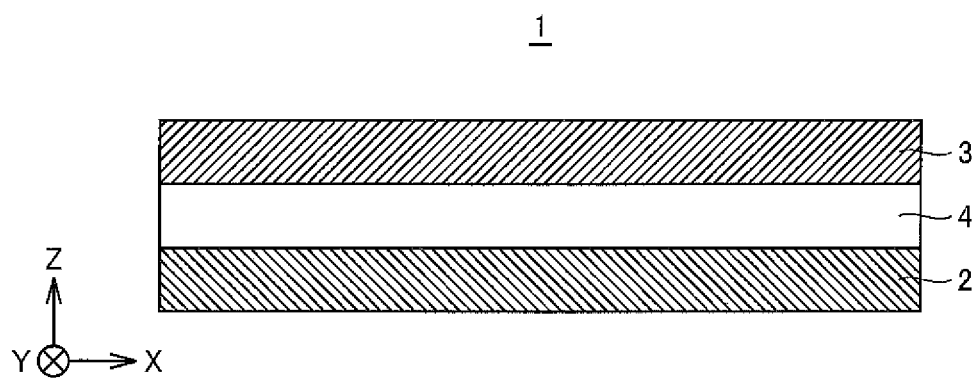
FIG. 1 is a schematic cross-sectional view of a touch-panel-equipped display device in Embodiment 1.

A touch-panel-equipped display device in one embodiment of the present invention is a touch-panel-equipped display device including an active matrix substrate that includes a plurality of pixels each of which corresponds to any one of N colors (N is a natural number equal to or greater than three), wherein the active matrix substrate includes: a plurality of source lines that are provided with respect to the pixels, respectively; a plurality of common electrodes that are used commonly for both of image display and touch position detection; a plurality of signal lines that are connected with the common electrodes, respectively; a source line driving circuit that is provided outside a display area and supplies data signals to the source lines; a common electrode driving circuit that is provided outside the display area and supplies a predetermined voltage signal to the signal lines; a plurality of source line connection parts that connect the source lines and the source line driving circuit; and a plurality of signal line connection parts that connect the signal lines and the common electrode driving circuit, wherein the source line connection parts are arranged in such a manner that N of the source line connection parts connected with the source lines of N adjacent ones of the pixels are arranged in different layers so that the N source line connection parts overlap with one another when viewed in a plan view, and the signal line connection parts are arranged at positions that do not overlap with the source line connection parts when viewed in a plan view (the first configuration).

According to the first configuration, outside the display area, the source line connection parts connecting the source lines for N adjacent ones of pixels and the source line driving circuit are arranged in such a manner that N of the source line connection parts are arranged in different layers so that the N of the source line connection parts overlap with one another when viewed in a plan view. Further, the signal line connection parts, which are connected with the signal lines, respectively, are arranged at positions that do not overlap with the source line connection parts when viewed in a plan view, outside the display area. Accordingly, as compared with a case where the signal line connection parts are arranged so as to overlap with the source line connection parts when viewed in a plan view, load capacitances of the signal line connection parts are reduced, and signal delays in the signal lines are reduced. Consequently, even with displacement (fluctuation) of the potential of the common electrode, the original potential of the common electrode can be easily restored, which makes it unlikely that display defects would occur.

The first configuration may be further characterized in that each of the signal line connection parts is provided in the same layer as that of any one of the N source line connection parts (the second configuration).

With the second configuration, the signal line connection parts can be formed in a step for forming a certain one of the N source line connection parts.

The first configuration may be further characterized in that each signal line connection part is composed of a plurality of sub-signal line connection parts that are provided in different layers, respectively (the third configuration).

According to the third configuration, one signal line connection part is composed of a plurality of sub-signal line connection parts, which makes it unlikely that disconnections would occur to the signal line connection parts, and allows the signal lines to have reduced resistances.

Any one of the first to third configurations may be further characterized in that each signal line is composed of a plurality of sub-signal lines that are provided in different layers, respectively, and the sub-signal lines are connected with one another within the display area (the fourth configuration).

According to the fourth configuration, one signal line is composed of a plurality of sub-signal lines, and therefore, this makes it unlikely that disconnections would occur to the signal lines, and that display defects and touch detection defects would occur due to disconnections of the signal lines.

The following description describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of a part of constituent members is omitted. Further, the dimension ratios of the constituent members illustrated in the drawings do not necessarily indicate the real dimension ratios.

Embodiment 1

FIG. 1 is a schematic cross-sectional view of a touch-panel-equipped display device 1 in the present embodiment. The touch-panel-equipped display device 1 in the present embodiment includes an active matrix substrate 2, a counter substrate 3, and a liquid crystal layer 4 interposed between the active matrix substrate 2 and the counter substrate 3. Each of the active matrix substrate 2 and the counter substrate 3 includes a glass substrate that is substantially transparent (having high translucency). Further, though the illustration is omitted, the touch-panel-equipped display device 1 includes a backlight that is provided so as to extend in a surface direction of the active matrix substrate 2 on a side opposite to the liquid crystal layer 4 in FIG. 1, and a pair of polarizing plates between which the active matrix substrate 2 and the counter substrate 3 are interposed. Though the illustration is omitted in this drawing, the counter substrate 3 includes color filters of three colors that are red (R), green (G), and blue (B).

The touch-panel-equipped display device 1 has a function of displaying an image and a function of detecting a position that a user touches on the displayed image (touch position). This touch-panel-equipped display device 1 is a so-called in-cell type touch panel display device in which elements necessary for detecting a touch position are formed on the active matrix substrate 2.

In the case of the touch-panel-equipped display device 1, the method for driving liquid crystal molecules contained in the liquid crystal layer 4 is the horizontal electric field driving method. To realize the horizontal electric field driving method, the pixel electrodes and the counter electrodes (common electrodes) for forming electric fields are formed on the active matrix substrate 2. The following description specifically describes the configuration of the active matrix substrate 2.

Figure 2:
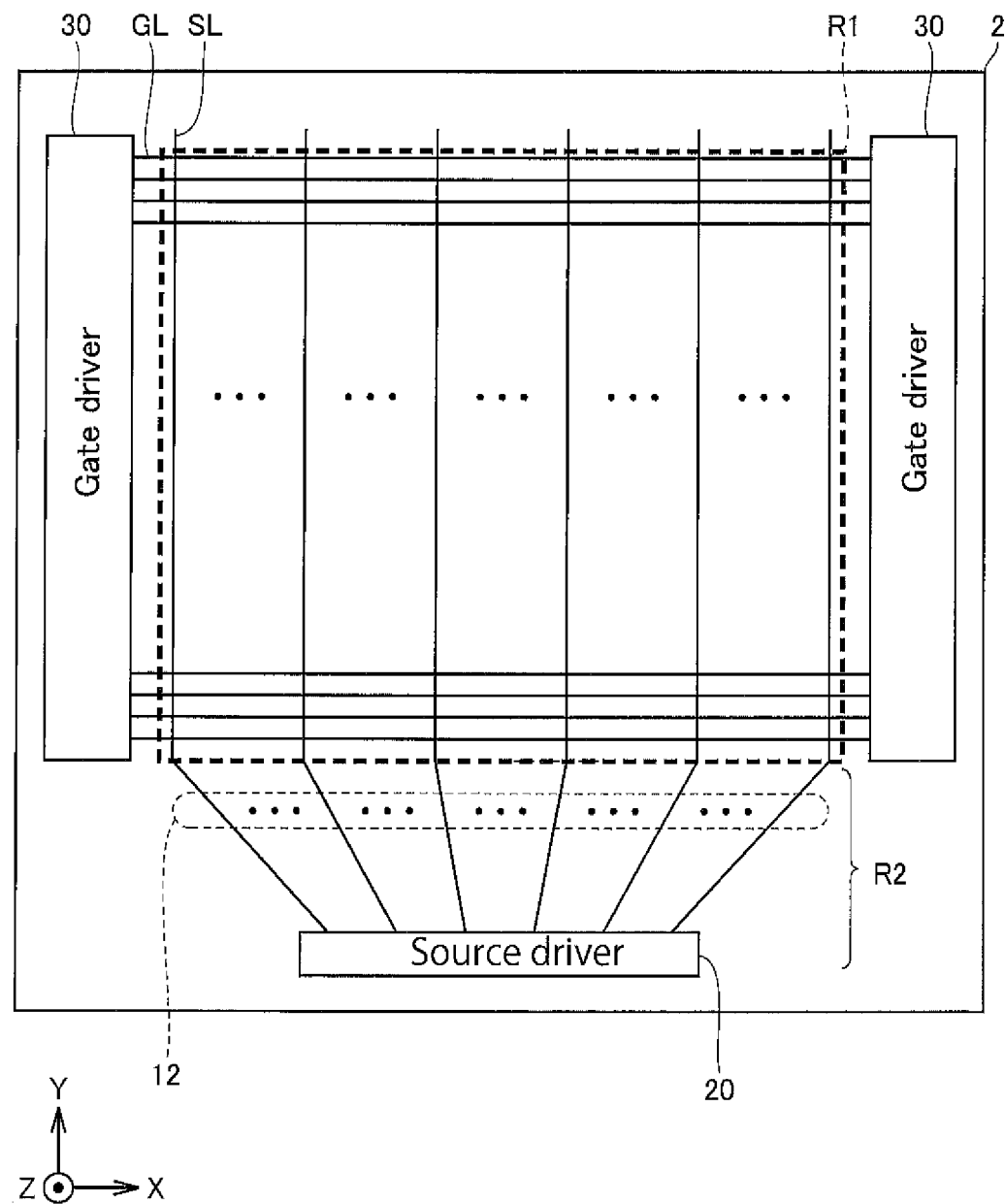
FIG. 2 is a plan view illustrating a schematic configuration of an active matrix substrate illustrated in FIG. 1.

FIG. 2 is a plan view illustrating a schematic configuration of the active matrix substrate 2. As illustrated in FIG. 2, the active matrix substrate 2 includes a plurality of gate lines GL, a plurality of source lines SL, a source driver 20, and gate drivers 30.

Though the illustration is omitted in this drawing, in the active matrix substrate 2, pixel electrodes are provided in areas defined by the gate lines GL and the source lines SL, whereby pixels are formed. Each pixel corresponds to any one of the colors of R, G, and B of the color filters provided on the counter substrate 3. Hereinafter the pixel corresponding to R is referred to as the pixel R, the pixel corresponding to G is referred to as the pixel G, and the pixel corresponding to B is referred to as the pixel B. One pixel R, one pixel G, and one pixel B compose one pixel element.

The active matrix substrate 2 includes a display area R1 formed with an area where the pixels are formed. Further, the active matrix substrate 2 includes thin film transistors (TFTs) (not illustrated), each of which is connected with one gate line GL, one source line SL, and one pixel electrode in each pixel.

The source driver 20 and the gate drivers 30 are provided outside the display area R1. The gate drivers 30 are provided outside the display area R1, in the vicinities of the ends on both sides of the gate lines GL, and are connected with each gate line GL. These two gate drivers 30 operate in synchronization with each other, and sequentially scan the gate lines GL.

The source driver 20 is provided in a frame area R2, which is outside the display area R1, and is on one of the end sides of the source lines SL. The source driver 20 and each source line SL are connected with each other in the frame area R2. Hereinafter connection parts in the frame area R2, which are the parts of connection between the source driver 20 and the source lines SL, are referred to as source line connection parts 12. Details of the structure of the source line connection part 12 in the frame area R2 are described below.

In the present embodiment, the source driver 20 supplies data voltages for displaying images to the respective source lines SL by column reverse driving. In this example, the pixels R, the pixels G, and the pixels B are arranged in the order of R, G, B, R, G, B . . . repeatedly in the direction in which the gate lines GL extend. The source driver 20 applies data voltages in such a manner that the polarity of the data voltages applied to the source lines SL of the pixels in the even-number-th rows, and the polarity of the data voltage applied to the source lines SL of the pixels in the odd-number-th rows, are opposite to each other, and reverses the polarity of the data voltage applied to each source line SL every frame. For example, in a case where the pixel R and the pixel B are pixels in an even-number-th row, and the pixel G is a pixel in an odd-number-th row, data voltage of the same polarity are applied to the source lines SL of the pixel R and the pixel B, while a data voltage of a polarity opposite to that for the pixel R and the pixel B is applied to the source line SL of the pixel G.

Figure 3:
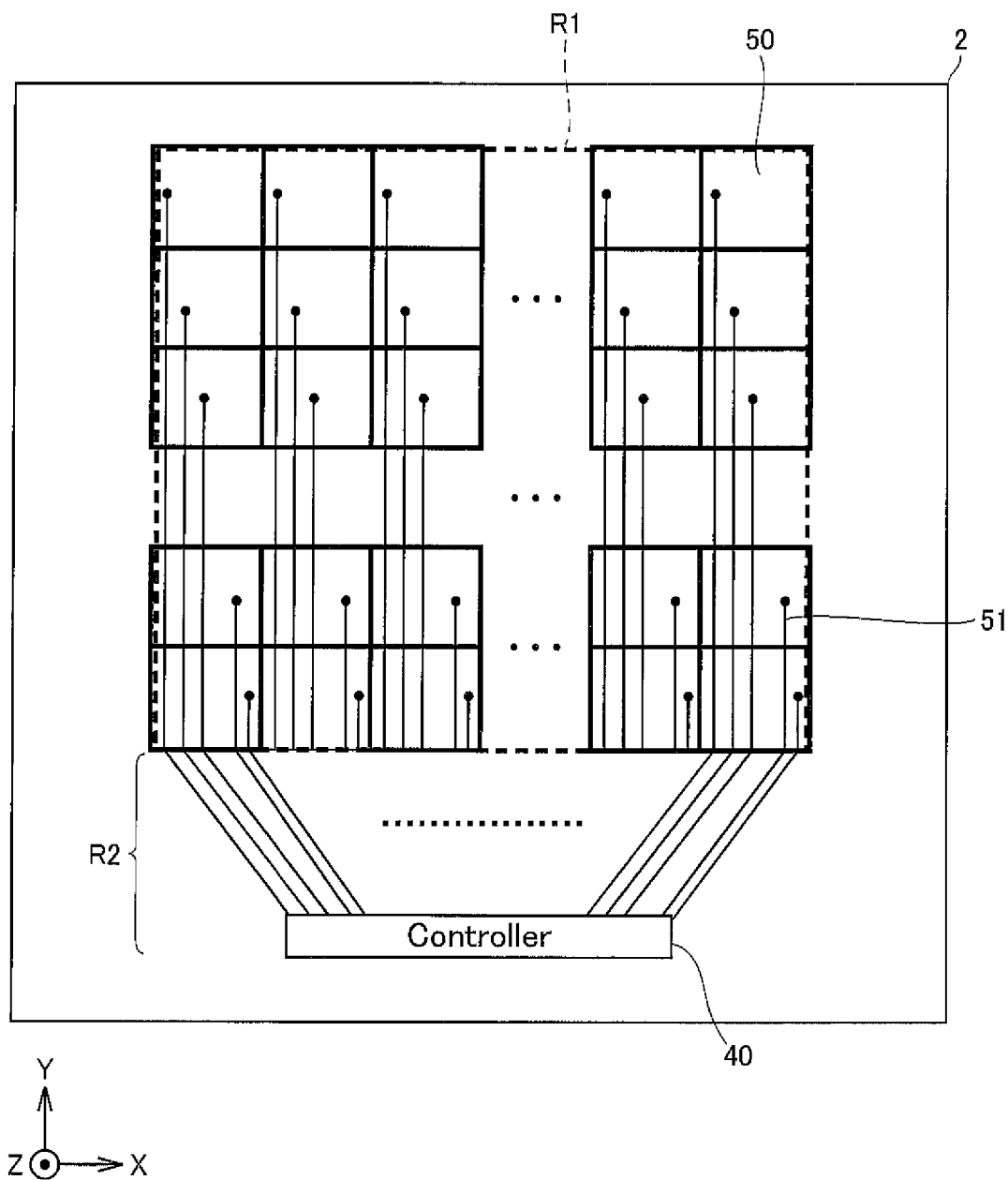
FIG. 3 is a plan view illustrating an exemplary arrangement of counter electrodes formed on the active matrix substrate illustrated in FIG. 2.

FIG. 3 schematically illustrates an exemplary arrangement of common electrodes formed on the active matrix substrate 2. As illustrated in FIG. 3, each common electrode 50 is in a rectangular shape, and a plurality of the common electrodes 50 are arranged in matrix on the active matrix substrate 2. Each common electrode 50 is, for example, in an approximately square shape whose side is several millimeters, which is greater than the pixel. Though the illustration is omitted in this drawing, slits (having a width of, for example, several micrometers) for causing horizontal electric fields to be generated between the same and the pixel electrodes (not illustrated) are formed in the common electrodes 50.

As illustrated in FIG. 3, the active matrix substrate 2 includes a controller 40 on a side of the frame area R2 where the source driver 20 illustrated in FIG. 2 is provided. The controller 40 performs a controlling operation for image display and a controlling operation for touch detection.

The common electrode 50 functions as a counter electrode for pixel electrode (not illustrated) in a controlling operation for image display, and functions as a touch detection electrode for detecting a touch position. In a controlling operation for image display, the controller 40 supplies a constant voltage to the signal lines 51 so as to cause the common electrodes 50 to function as counter electrodes. On the other hand, in a controlling operation for touch position detection, the controller 40 supplies an alternating-current voltage signal (hereinafter referred to as a touch driving signal) for detecting a touch position to the signal lines 51 so as to cause the common electrodes 50 to function as touch detection electrodes.

The controller 40 and each common electrode 50 are connected with each other by the signal line 51 extending in the Y axis direction. In other words, the same number of the signal lines 51 as the number of the common electrodes 50 are formed on the active matrix substrate 2. In this example, the signal lines 51 are formed with the same metal material as that of the source lines SL (see FIG. 2), in the same layer as that of the source lines SL, but the signal lines 51 may be formed with a metal material different from that of the source lines SL.

Figure 4A:
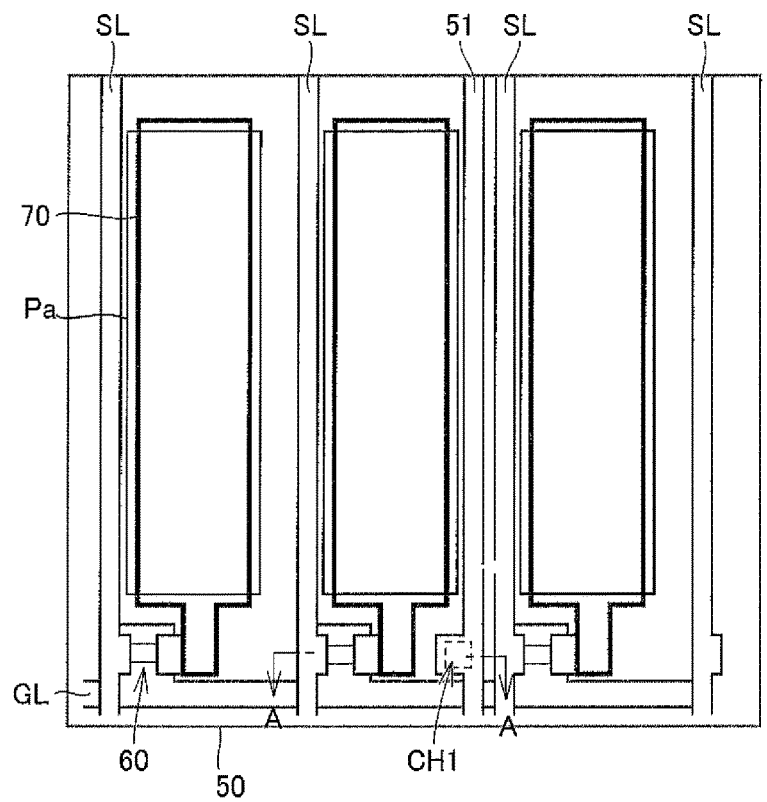
FIG. 4A is a plan view illustrating a schematic configuration of a pixel provided with the signal line illustrated in FIG. 3.
Figure 4B:
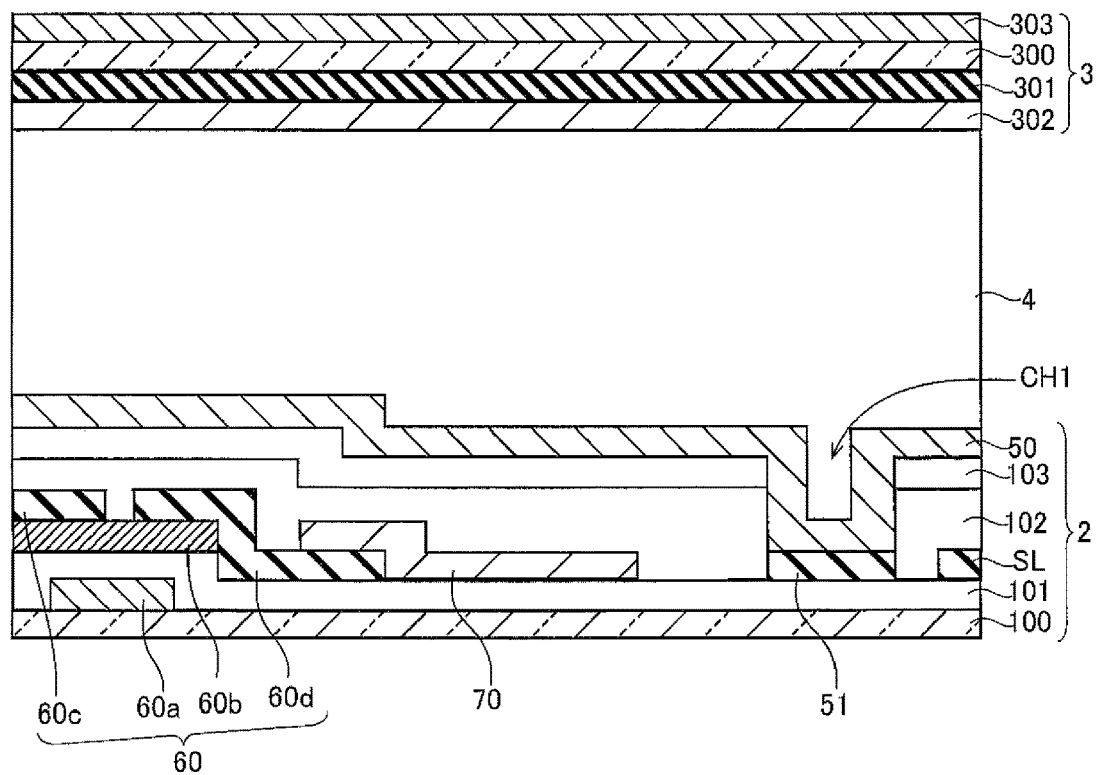

Here, a plan view illustrating a schematic configuration of the pixel provided with the signal line 51 is illustrated in FIG. 4A, and a cross-sectional view taken along line A-A indicated in FIG. 4A is illustrated in FIG. 4B.

As illustrated in FIG. 4A, the pixel includes a TFT 60 connected with the source line SL and the gate line GL, and a pixel electrode 70 connected with the TFT 60. The common electrode 50 is arranged so as to cover a plurality of the pixels, and has a plurality of slits (not illustrated) at positions overlapping with the pixel electrodes 70. The signal line 51 is arranged outside an opening Pa of the pixel in approximately parallel with the source line SL, and is connected with the common electrode 50 via a contact hole CH1. The following description specifically explains the cross-sectional structure of the pixel.

As illustrated in FIG. 4B, in the active matrix substrate 2, the TFT 60 is formed on the substrate 100 having translucency. The TFT 60 includes a gate electrode 60a, a semiconductor layer 60b, a source electrode 60c, and a drain electrode 60d. The gate electrode 60a is integrally formed with the gate line GL. A gate insulating film 101 is formed so as to cover the gate electrode 60a, and the semiconductor layer 60b is provided on the gate insulating film 101. The source electrode 60c is integrally formed with the source line SL, and the drain electrode 60d is formed with the same material as that of the source line SL. The source electrode 60c and the drain electrode 60d are provided on the gate insulating film 101, and partially cover the semiconductor layer 60b in such a manner that the source electrode 60c and the drain electrode 60d are positioned apart from each other on the semiconductor layer 60b.

On the gate insulating film 101, the pixel electrode 70 connected with the drain electrode 60d is provided, and the signal line 51 is arranged so as to be positioned apart from the pixel electrode 70. The signal line 51 is provided in the same layer as that of the source line SL.

A passivation film (insulating film) 102 is provided so as to cover the source electrode 60c and the drain electrode 60d, as well as the pixel electrode 70, and the source line SL; and on the passivation film 102, a passivation film 103 is laminated. Above the signal line 51, the contact hole CH1, which passes through the passivation film 102 and the passivation film 103, is formed.

The common electrode 50 is provided on the passivation film 103, and is connected with the signal line 51 at the contact hole CH1. Above the common electrode 50, the counter substrate 3 is provided, with the liquid crystal layer 4 being interposed therebetween.

In the counter substrate 3, a black matrix 301 is formed on a liquid crystal layer 4 side surface of the substrate 300 having translucency, and an overcoat layer 302 is formed so as to cover the black matrix 301. Further, on a surface of the substrate 300 on a side opposite to the liquid crystal layer 4 side, a conductive film 303 formed with ITO or the like for removing static electricity is provided.

In a controlling operation for touch detection, the common electrodes 50 are controlled so as to have a potential of the touch driving signal through the signal lines 51. When a human finger or the like touches the display surface, a capacitor is formed between the common electrode 50 and the finger or the like, the electric field at the common electrode 50 changes, and an electric signal (touch detection signal) indicating the change in the electric field is input to the controller 40 through the signal line 51. The controller 40 detects a touch position based on the touch detection signal. In other words, the signal line 51 functions as a line for the transmission/reception of the touch driving signal and the touch detection signal.

Next, the following description describes the structure of the frame area R2 (see FIGS. 2 and 3) of the active matrix substrate 2 in the present embodiment.

Figure 5:
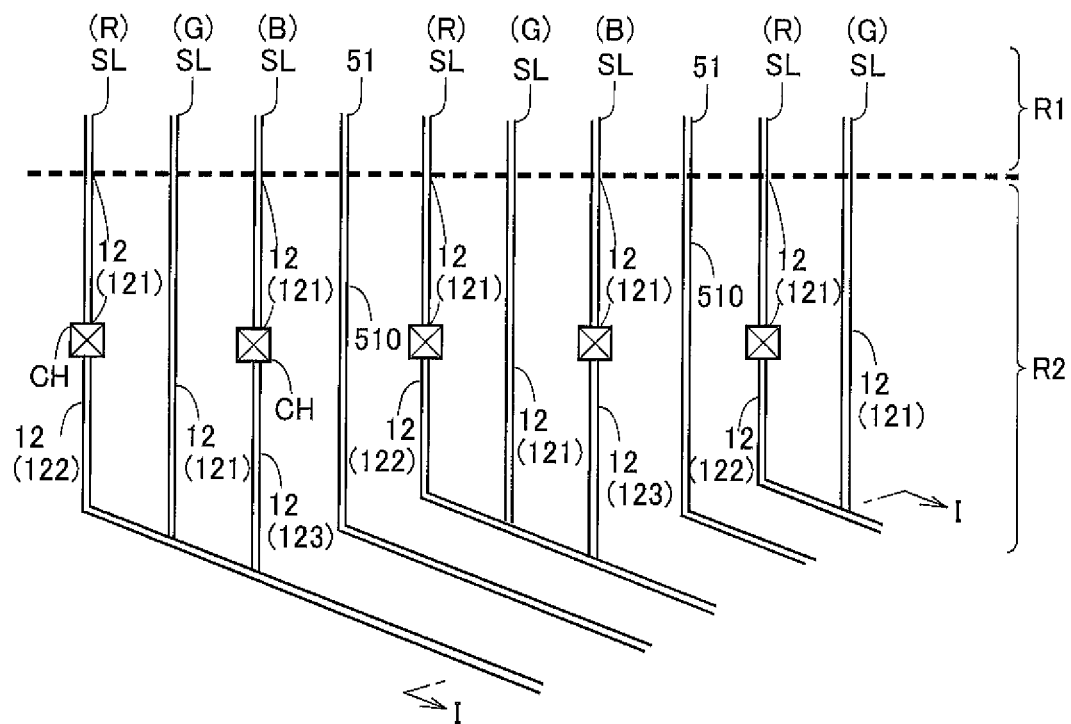
FIG. 5 is an enlarged plan view of a partial area of a frame area in Embodiment 1.
Figure 6:
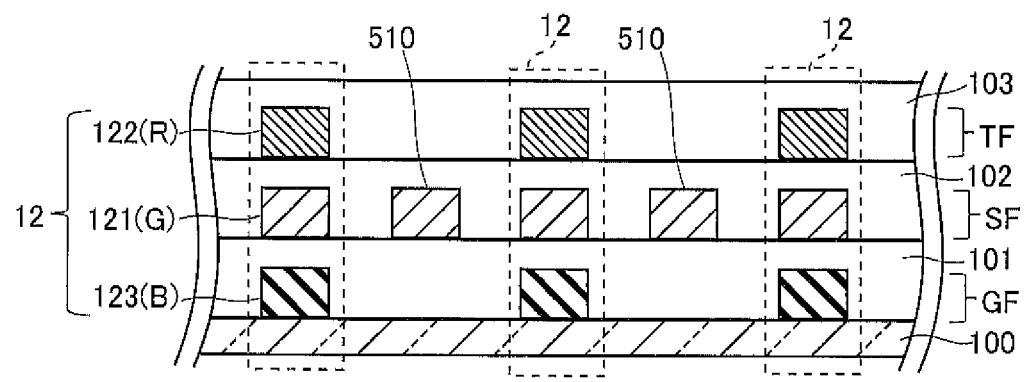
FIG. 6 is a cross-sectional view taken along line I-I in FIG. 5.

FIG. 5 is an enlarged plan view illustrating a part in the vicinity of the boundary between the display area R1 and the frame area R2. FIG. 6 is a cross-sectional view taken along line I-I illustrated in FIG. 5.

"(R)", "(G)", and "(B)" indicating the source lines SL in an upper part of FIG. 5 indicate the colors of the color filters corresponding to the pixels to which the source lines SL are connected, respectively. Hereinafter the source line SL connected to the pixel R is referred to as a "source line SL(R)", the source line SL connected to the pixel G is referred to as a "source line SL(G)", and the source line SL connected to the pixel B is referred to as a "source line SL(B)".

The source line connection part 12 is a line that connects the source line SL and the controller 40 (see FIG. 3) with each other, and that is arranged in the frame area R2 outside the display area R1. In this example, the source line connection part 12 connected with the source line SL(G) (hereinafter referred to as a "source line connection part 12G") is formed with an extension of the source line SL(G), which is a source line extension part 121.

On the other hand, the source line connection part 12 connected with the source line SL(R) (hereinafter referred to as a "source line connection part 12R"), and the source line connection part 12 connected with the source line SL(B) (hereinafter referred to as a "source line connection part 12B") are formed with partial lines 122 or 123, which are made of a metal material different from that of the source line extension parts 121 as the extensions of the source lines SL(R) and SL(B) as well as the source lines SL. The partial lines 122 and 123, however, may be made of the same material as the material of the source lines SL. The source line extension part 121 and the partial line 122 are connected with each other via a contact hole CH, and so do the source line extension part 121 and the partial line 123.

More specifically, the partial lines 122(B) of the source line connection parts 12B are made of the same material as the material of the gate lines GL, and as illustrated in FIG. 6, the partial lines 122(B) are provided on the substrate 100. In other words, in the display area R1, the partial lines 122(B) are provided in the same layer as that of the gate lines GL (hereinafter referred to as a "first layer GF").

The partial lines 121(G) of the source line connection parts 12G are made of the same material as the material of the source lines SL as described above, and in the display area R1, the partial lines 121(G) are provided in the same layer as that of the source lines SL (hereinafter referred to as a "second layer SF").

In the present embodiment, each signal line 51 is extended from the display area R1 to the frame area R2, as illustrated in FIG. 5. The extension part 510, which is an extension to the frame area R2, is provided in the same layer as that of the partial lines 121(G), i.e., the second layer SF, as illustrated in FIG. 6. In this example, the extension part 510 is a line part that connects the signal line 51 in the display area R1 and the controller 40 (see FIG. 3), and is hereinafter referred to as a "signal line connection part 510".

On the gate insulating film 101, the passivation film 102 is provided so as to cover the part lines 121(G), and on the passivation film 102, the partial line 122(R) of the source line connection part 12R is provided. In this example, the partial lines 122(R) are made of the same metal material as that of the gate lines GL and the source lines SL; however, the partial lines 122(R) may be made of any metal material different from the metal material of the gate lines GL and the source lines SL, as long as the material is a conductive material having a resistance approximately at the same level as the resistance of the gate lines GL and the source lines SL. Hereinafter the layer where the partial lines 122(R) are formed is referred to as third layer TF.

On the passivation film 102, the passivation film 103 is provided so as to cover the partial lines 122(R).

In this way, in the frame area R2, the signal line connection parts 510 are arranged so as not to overlap with the source line connection parts 12 when viewed in a plan view. As compared with a case where the signal line connection parts 510 are arranged so as to overlap with some source line connection parts 12, therefore, load capacitances of the signal line connection parts 510 are reduced. This makes it unlikely that signal delays would occur to the signal lines 51. As a result, when a data voltage is applied to each source line SL in the above-described column reverse driving, even with displacement (fluctuation) of the potential of the common electrode 50, the original potential of the common electrode 50 is easily restored, which makes it unlikely that display defects such as the phenomenon of the greenish screen would occur. Further, the decreases in the load capacitances of the signal lines 51 lead to decreases in signal delays occurring to the common electrodes 50 in the touch position detection, thereby making it unlikely that touch detection defects would occur. The above-described embodiment is described with reference to an example in which the column reverse driving is performed, but the dot inversion driving or the like may be performed instead.

Embodiment 2

Embodiment 1 above is described with reference to an example in which the signal line connection parts 510 are extensions of the signal lines 51 and are formed in the same layer as that of the signal lines 51, i.e., the second layer SF. The present embodiment is described with reference to an example in which the configuration of the signal line connection part is different from that in Embodiment 1.

Figure 7A:
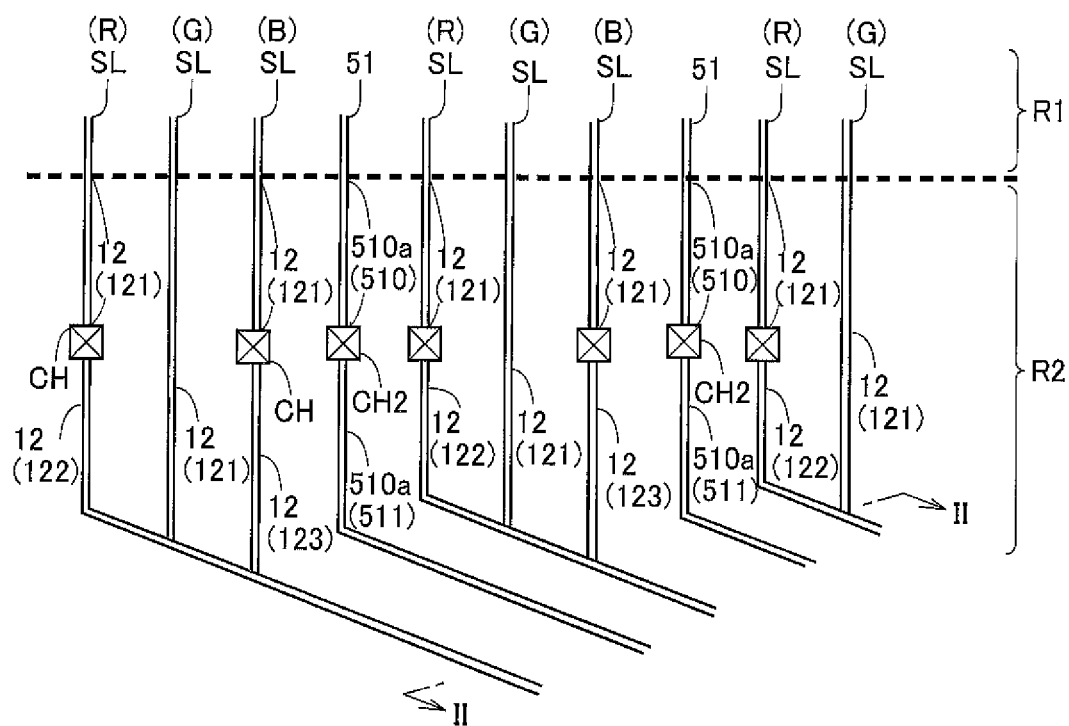
FIG. 7A is an enlarged plan view of a partial area in vicinities of a boundary between a display area and a frame area in Embodiment 2.
Figure 7B:
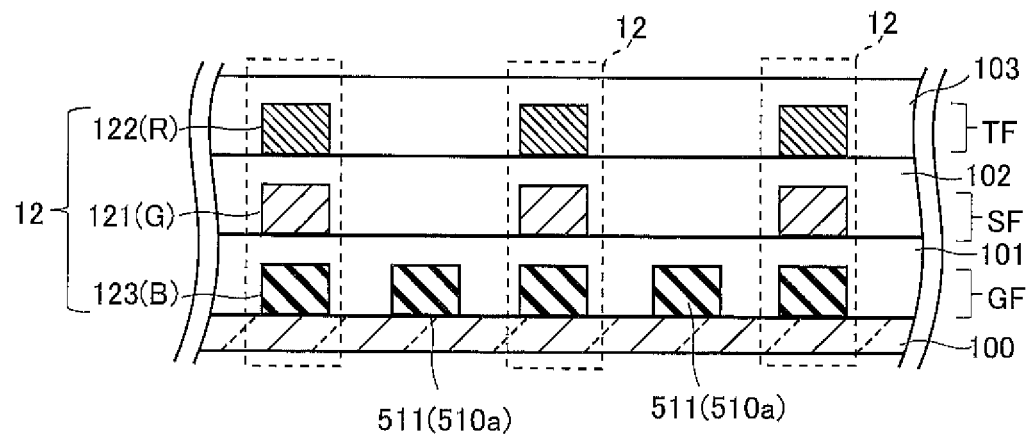
FIG. 7B is a cross-sectional view taken along line II-II in FIG. 7A.

FIGS. 7A and 7B are a plan view and a cross-sectional view illustrating exemplary signal line connection parts in the present embodiment. FIG. 7A is an enlarged plan view illustrating an area in the vicinity of the boundary between the display area R1 and the frame area R2 in the present embodiment, and FIG. 7B is a cross-sectional view taken along line II-II in FIG. 7A.

As illustrated in FIG. 7A, each signal line connection part 510A is composed of an extension part 510, which is an extension of the signal line 51, and a partial line 511 for signal line, which is arranged in the same first layer GF in which the partial lines 123(B) are arranged. The partial lines 511 for signal line may be made of the same metal material as that of the gate lines GL, and may be formed in the same step as the step for the gate line GL. Or alternatively, the partial lines 511 for signal line may be formed in a step different from the step for forming the gate lines GL, by using a metal material different from that for the gate lines GL. The extension part 510 and the partial line 511 for signal line are connected with each other in the frame area R2 via a contact hole CH2 (see FIG. 7A), which passes through the gate insulating film 101.

Figure 7C:
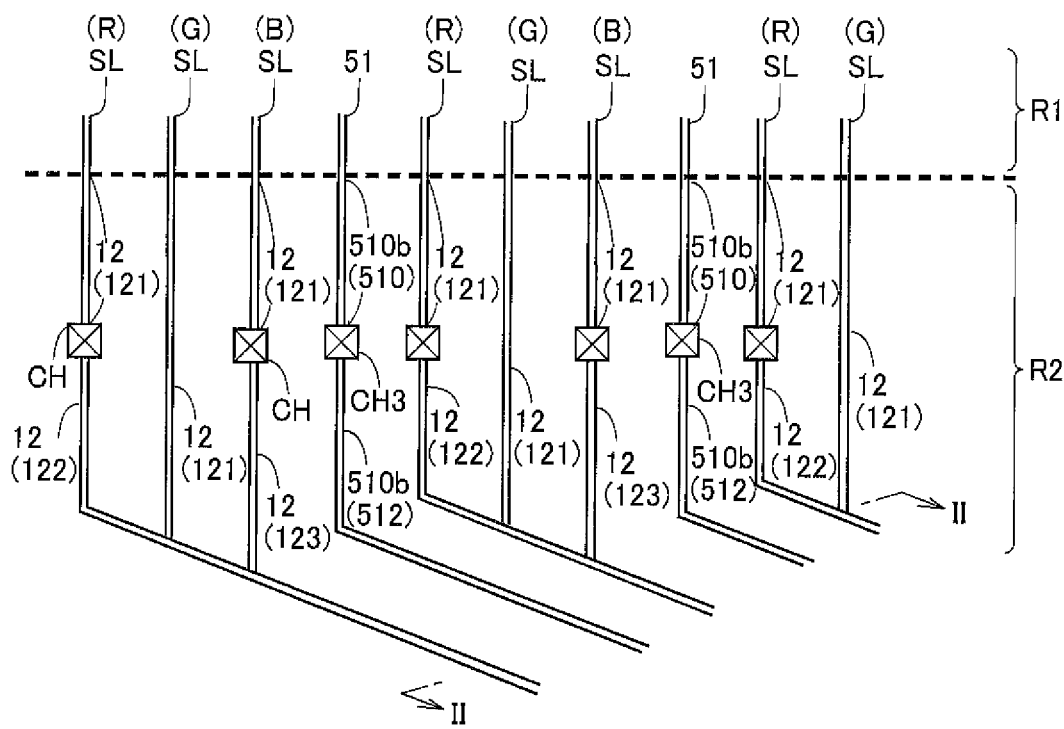
FIG. 7C is a plan view illustrating an exemplary configuration of a signal line connection part different from that in FIG. 7A.
Figure 7D:
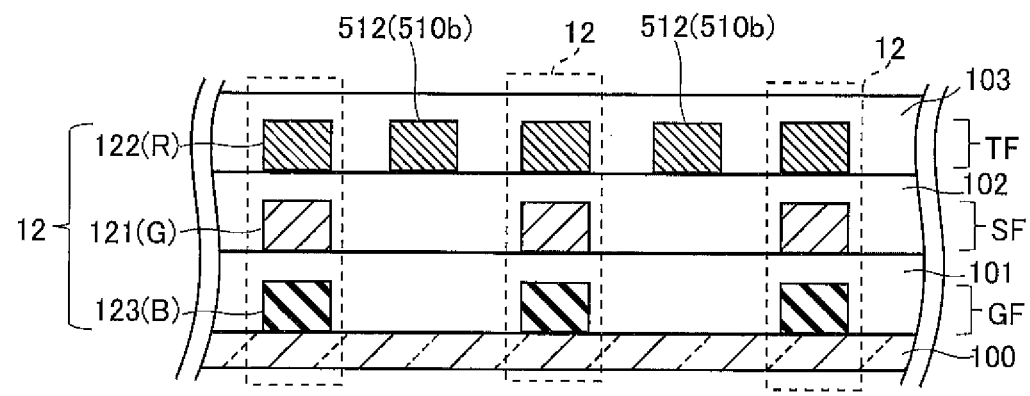
FIG. 7D is a cross-sectional view taken along line II-II in FIG. 7C.

FIGS. 7C and 7D are a plan view and a cross-sectional view illustrating exemplary signal line connection parts different from those illustrated in FIGS. 7A and 7B. FIG. 7C is an enlarged plan view illustrating a partial area in the vicinity of the boundary between the display area R1 and the frame area R2, and FIG. 7D is a cross-sectional view taken along line II-II in FIG. 7C.

As illustrated in FIG. 7C, a signal line connection part 510b is composed of an extension part 510, which is an extension of the signal line 51, and a partial line 512 for signal line, which is arranged in the same layer as that of the partial line 122(R), which is the third layer TF. The partial lines 512 for signal line may be formed with the same metal material as that of the partial lines 122(R) of the source line connection parts 12, in the same step as that for forming the partial lines 122(R), or alternatively, may be formed with a metal material different from that for the partial lines 122(R), in a step different from that for forming the partial lines 122(R). The extension part 510 and the partial line 512 for signal line are connected with each other in the frame area R2, in the vicinity of the boundary between the display area R1 and the frame area R2, via a contact hole CH3 (see FIG. 7C) passing through the passivation film 102.

In this example, the signal line 51 (extension part 510) and the partial line 511 or 512 for signal line are connected with each other in the vicinity of the boundary between the display area R1 and the frame area R2, but the connection position is not limited to this. For example, the connection position may be within the frame area R2, or within the display area R1.

Whereas the signal line connection parts 510 of Embodiment 1 are arranged in the second layer SF, the partial lines 511 or 512 for signal line in the present embodiment are provided in the first layer GF or the third layer TF, as illustrated in FIGS. 7A to 7D. As compared with Embodiment 1, therefore, the distance increases between the partial line 511 for signal line of the signal line connection part 510a, or the partial line 512 for signal line of the signal line connection part 510b, and the source line connection part 122(R) in the third layer TF, or the source line connection part 123(B) in the first layer GF. This causes a load capacitance between the partial line 511 for signal line, or the partial line 512 for signal line, and the partial line 122(R), 121(G), 123(B) of an adjacent one of the source line connection parts 12, to be reduced, thereby causing signal delays in the signal line 51 to be further reduced.

Embodiment 3

Embodiments 1 and 2 above are described with reference to an example in which each signal line connection part is formed with a single metal layer; the present embodiment is described with reference to an example in which each signal line connection part is formed with a plurality of metal layers.

Figure 8A:
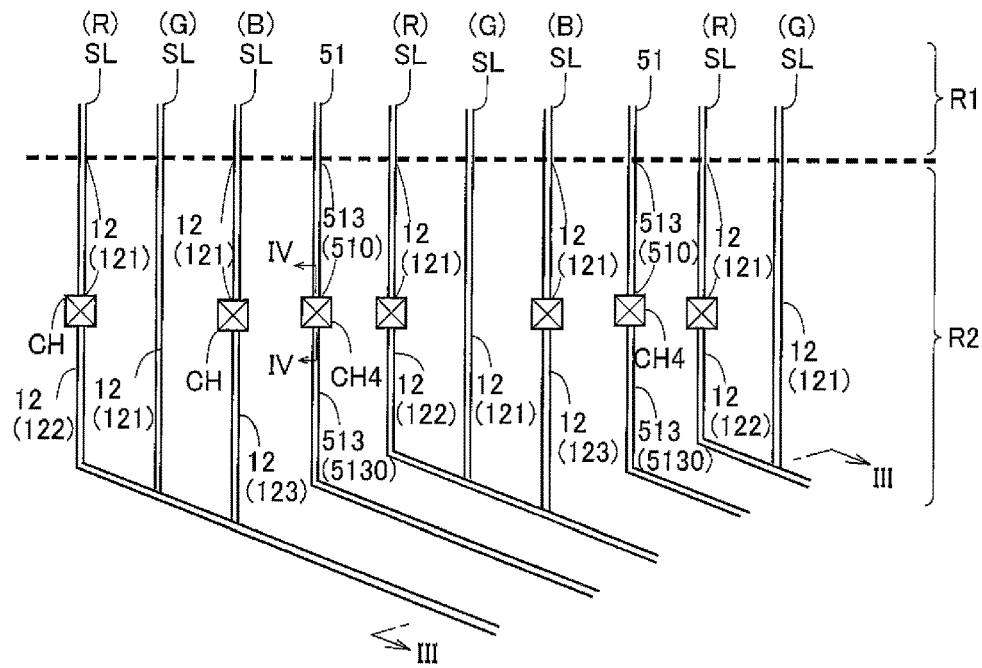
FIG. 8A is an enlarged plan view of a partial area in vicinities of a boundary between a display area and a frame area in Embodiment 3.
Figure 8B:
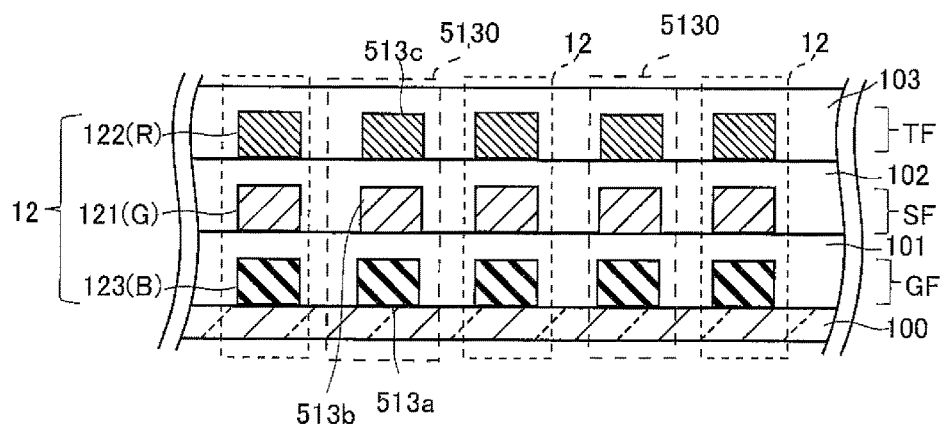
FIG. 8B is a cross-sectional view taken along line III-III in FIG. 8A.
Figure 8C:
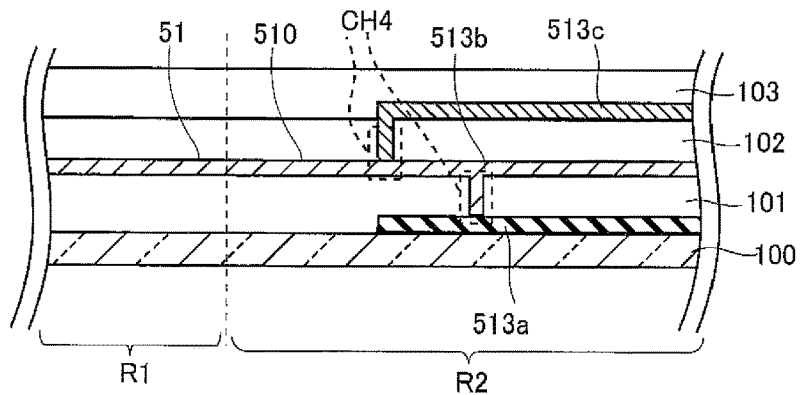
FIG. 8C is a cross-sectional view taken along line IV-IV in FIG. 8A.

FIG. 8A is an enlarged plan view of a partial area in the vicinity of a boundary between the display area R1 and the frame area R2 in the present embodiment, FIG. 8B is a cross-sectional view taken along line III-III in FIG. 8A, and FIG. 8C is a cross-sectional view taken along line IV-IV in FIG. 8A.

As illustrated in FIG. 8A, a signal line connection part 513 in the present embodiment is composed of an extension part 510, which is an extension of the signal line 51, and a partial line 5130 for signal line.

As illustrated in FIG. 8B, the partial line 5130 for signal line includes sub-signal line connection parts 513a to 513c, which are provided in the first layer GF, the second layer SF, and the third layer TF, respectively.

The sub-signal line connection parts 513a are formed in the same layer as that of the gate lines GL, that is, the first layer GF. The sub-signal line connection parts 513a may be made of the same metal material as that of the gate lines GL, or may be made of a metal material different from that of the gate lines GL.

Each sub-signal line connection part 513b is formed by extending the signal line 51 to the frame area R2. In other words, the sub-signal line connection parts 513b are formed in the same layer as that of the signal lines 51, that is, the second layer SF.

The sub-signal line connection parts 513c are formed in the same layer as that of the partial lines 122(R), that is, the third layer TF. The sub-signal line connection parts 513c may be made of the same metal material as that of the partial lines 122(R), or may be made of a metal material different from that of the partial lines 122(R).

In this example, the sub-signal line connection parts 513a to 513c are connected with the signal lines 51, in the vicinity of the boundary between the display area R1 and the frame area R2, through contact holes CH4, as illustrated in FIG. 8C; the configuration of the connection positions for connection with the signal lines 51, however, is not limited to this, and the connection positions may be anywhere as long as they are within the frame area R2.

In this way, the signal line connection part 513 is formed with the partial line 5130 for signal line, which is composed of the three sub-signal line connection parts 513a to 513c, as well as the extension part 510 of the signal line 51. This configuration makes it unlikely that the signal line connection part 513 would be easily disconnected, and allows the resistance of the signal line connection part 513 to be reduced to approximately ⅓, as compared with Embodiment 1. This makes it unlikely that signal delays would occur to the signal lines 51, as compared with Embodiment 1. As a result, even with displacement (fluctuation) of the potential of the common electrode 50 due to the column reverse driving or the like, the original potential of the common electrode 50 can be easily restored more quickly. In this case, the resistance of each signal line connection part 513 is reduced to about ⅓ of that in Embodiment 1. With this, therefore, the width of the signal line connection part 513 can be set smaller than that in Embodiment 1, and the width of the source line SL can be set greater than that in Embodiment 1. This configuration makes it possible to prevent disconnections from occurring to the source lines SL. Besides, even with this configuration, it is possible to prevent disconnections from occurring to the signal line connection parts 513.

Incidentally, the widths of the sub-signal line connection parts 513a to 513c may be equal, or may be different.

The above-described example is described with reference to an exemplary configuration in which each signal line connection part 513 is composed of the three sub-signal line connection parts 513a to 513c, but the signal line connection part 513 may be composed of two sub-signal line connection parts. In other words, each signal line connection part 513 may be composed of two sub-signal line connection parts that are provided, respectively, in two layers that are the first layer GF and either the second layer SF or the third layer TF, or, two layers that are the second layer SF and the third layer TF.

The foregoing description describes an example of the touch-panel-equipped display device according to the present invention, but the configuration of the touch-panel-equipped display device according to the present invention is not limited to the configurations of the above-described embodiments; the configuration may be any of a variety of modification configurations. The following description describes the modification examples.

(1) The above-described embodiments are described with reference to an example in which the signal lines 51 in the display area R1 are arranged in the same layer as that of the source lines SL, i.e., the second layer SF, and the source lines SL and the signal lines 51 are formed in the same step, but the signal lines 51 may be formed in the third layer TF. In the above-described embodiments, since the signal lines 51 are formed in the same layer as that of the source lines SL, there is a possibility that the source lines SL and the signal lines 51 are short-circuited when etching for forming the source lines SL and the signal lines 51 is performed in the process for producing the active matrix substrate 2. In this modification example, the signal lines 51 are formed in the third layer TF, and therefore, the signal lines 51 and the source lines SL are not short-circuited.

Figure 9:
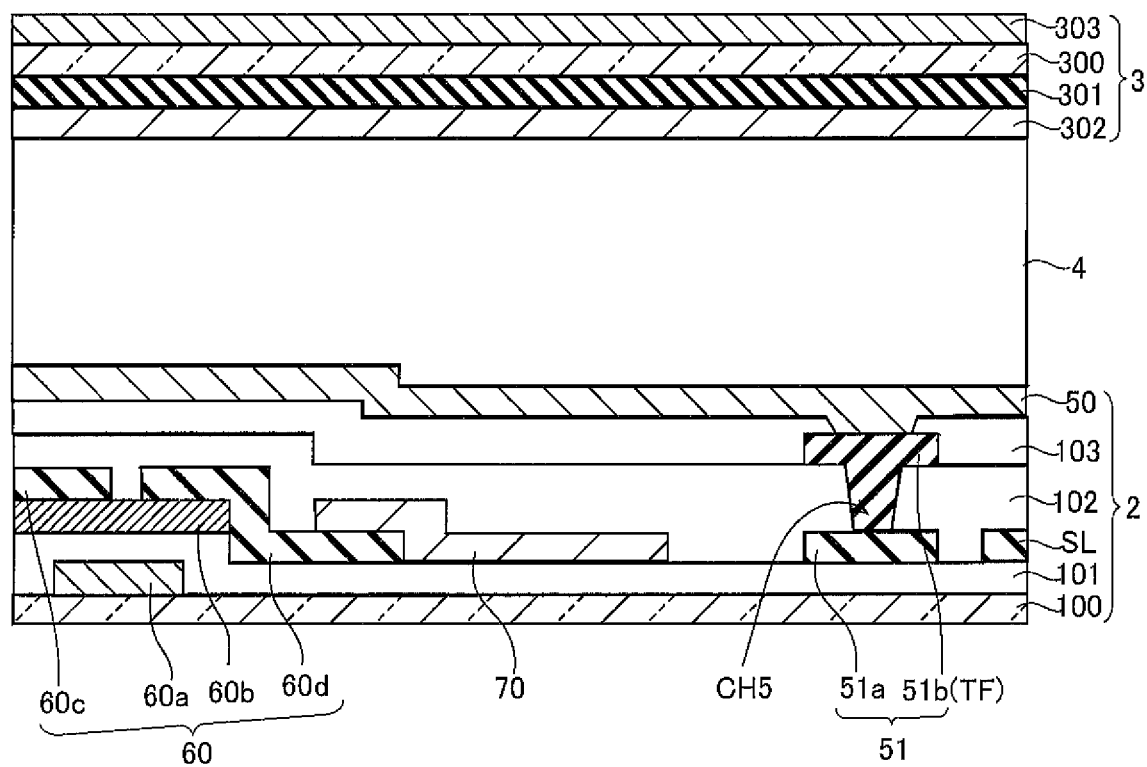
FIG. 9 is a schematic cross-sectional view of a display device Modification Example (1).

Further, for example, the signal lines 51 in the display area R1 may be formed with sub-signal lines provided in a plurality of layers that are different from one another. More specifically, each signal line 51 may be composed of a sub-signal line formed in the second layer SF and a sub-signal line formed in the third layer TF. In other words, as illustrated in FIG. 9, sub-signal lines 51a are formed in the same layer as that of the source lines SL, and in the third layer TF, sub-signal lines 51b are formed at positions that overlap with the sub-signal lines 51a when viewed in a plan view. In this case, the sub-signal lines 51a and the sub-signal lines 51b are connected with each other in the display area R1 through contact holes CH5. With this configuration, it is unlikely that disconnections would occur to the signal lines 51, resulting in that the reliability can be improved.

Figure 10A:
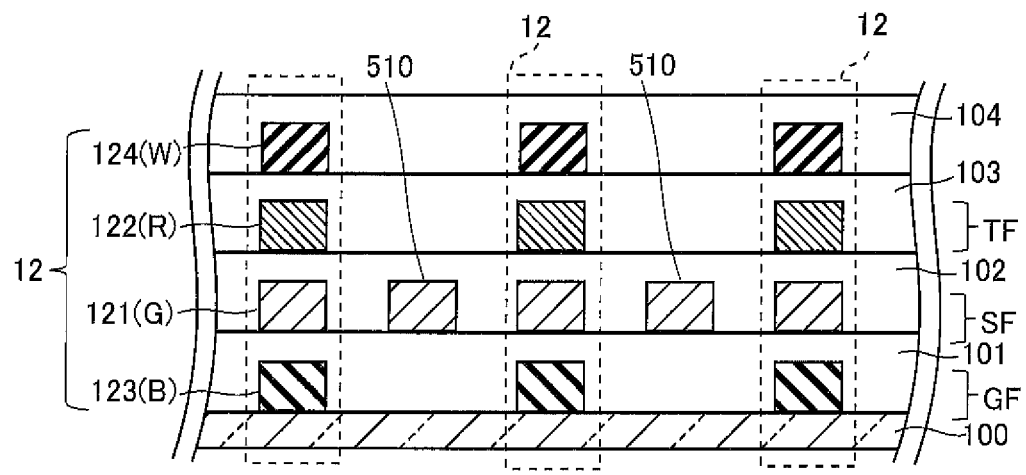
FIG. 10A is a schematic cross-sectional view illustrating an exemplary arrangement of signal line connection parts and source line connection parts in Modification Example (2).

(2) The above-described embodiments are described with reference to an example in which one picture element is composed of pixels of three colors of R, G, and B, but one picture element may be composed of pixels of four or more colors of R, G, B, W (white), and the like. In this case, as illustrated in FIG. 10A, partial lines 124(W) of the source line connection parts 12 connected with the source lines SL of the pixels W are arranged on the passivation film 103, and a passivation film 104 is arranged so as to cover the partial lines 124(W). The partial lines 124(W) may be made of a metal material having a resistance at a level approximately equal to that of the gate lines GL or the source lines SL, or alternatively, may be made of the same metal material as that of the gate lines GL or the source lines SL.

Incidentally, the example illustrated in FIG. 10A is described with reference to an exemplary configuration in which the signal line connection parts 510 and the source line connection parts 12 are arranged so as not to overlap with each other when viewed in a plan view in the frame area R2, but the configuration may be such as, for example, the configuration illustrated in FIG. 10B.

Figure 10B:
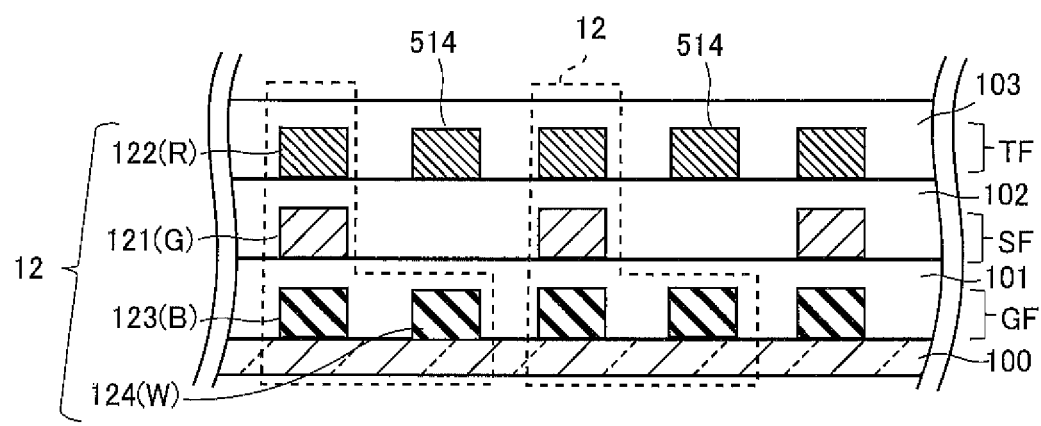
FIG. 10B is a schematic cross-sectional view illustrating another exemplary arrangement of signal line connection parts and source line connection parts, the arrangement being different from that in FIG. 10A.

In the example illustrated in FIG. 10B, the partial lines 124(W) are provided in the same layer as that of the partial lines 123(B), that is, the first layer GF, and the signal line connection parts 514 are provided in the same layer as that of the partial lines 122(R), that is, the third layer TF. In other words, the signal line connection parts 514 are arranged so that the gate insulating film 101 and the passivation film 102 are interposed between the signal line connection parts 514 and the partial lines 124(W), so as to overlap with the partial lines 124(W) when viewed in a plan view. In this case, between the signal line connection parts 514 and the partial lines 124(W), the insulating films of the two layers (the insulating films 101 and 102) are provided. Accordingly, as compared with a case of overlapping with a single-layer insulating film being interposed therebetween, load capacitances with respect to the signal line connection parts 514 are reduced. The effect of reducing the load capacitances with respect to the signal line connection parts 514, however, is higher in the case where, as is the case with the above-described embodiments, the signal line connection parts 514 are provided so as not to overlap with any of the partial lines of the source line connection parts 12 when viewed in a plan view.

(3) The above-described embodiments are described with reference to an example in which the signal line connection parts are formed in the same layer as any one of the three layers of the source line connection parts 12 connected with the source lines SL(R), SL(G), and SL(B), but the configuration may be such that the signal line connection parts are formed in a layer in which none of the source line connection parts 12 of the three kinds is provided, in the frame area R2.

DESCRIPTION OF REFERENCE NUMERALS

1: touch-panel-equipped display device
2: active matrix substrate
3: counter substrate
4: liquid crystal layer
12: source line connection part
20: source driver
30: gate driver
40: controller
50: counter electrode (common electrode)
51: signal line
101: gate insulating film
102, 103: passivation film
121 to 123, 124(W): partial line
TF: conductive layer 510, 510a, 510b, 513: signal line connection part
513a to 513c: sub-signal line connection part
511, 512, 5130: partial line for signal line
GL: gate line
SL: source line

The invention claimed is:

1. A touch-panel-equipped display device comprising an active matrix substrate that includes a plurality of pixels each of which corresponds to any one of N colors (N is a natural number equal to or greater than three),
wherein the active matrix substrate includes:
a plurality of source lines that are provided with respect to the pixels, respectively;
a plurality of common electrodes that are used commonly for both of image display and touch position detection;
a plurality of signal lines that are connected with the common electrodes, respectively;
a source line driving circuit that is provided outside a display area and supplies data signals to the source lines;
a common electrode driving circuit that is provided outside the display area and supplies a predetermined voltage signal to the signal lines;
a plurality of source line connection parts that connect the source lines and the source line driving circuit; and
a plurality of signal line connection parts that connect the signal lines and the common electrode driving circuit,
wherein the source line connection parts are arranged in such a manner that N of the source line connection parts connected with the source lines of N adjacent ones of the pixels are arranged in different layers so that the N source line connection parts overlap with one another when viewed in a plan view, and the signal line connection parts are arranged at positions that do not overlap with the source line connection parts when viewed in a plan view.

2. The touch-panel-equipped display device according to claim 1,
wherein each of the signal line connection parts is provided in the same layer as that of any one of the N source line connection parts.

3. The touch-panel-equipped display device according to claim 1,
wherein each signal line connection part is composed of a plurality of sub-signal line connection parts that are provided in different layers, respectively.

4. The touch-panel-equipped display device according to claim 1,
wherein each signal line is composed of a plurality of sub-signal lines that are provided in different layers, respectively, and
the sub-signal lines are connected with one another within the display area.

* * * * *